United States Patent
Phan (10) Patent No.: US 6,651,202 B1
(45) Date of Patent: Nov. 18, 2003

(54) BUILT-IN SELF REPAIR CIRCUITRY UTILIZING PERMANENT RECORD OF DEFECTS

(75) Inventor: Tuan L. Phan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 42 days.

(21) Appl. No.: 09/802,198

(22) Filed: Mar. 8, 2001

Related U.S. Application Data (63) Continuation of application No. 09/237,769, filed on Jan. 26, 1999, now abandoned.

(51) Int. Cl.⁷ .............................................. G01R 31/28
(52) U.S. Cl. ....................................... 714/733; 714/735
(58) Field of Search .............................. 365/200; 714/7, 714/733, 718, 719, 723, 720, 735; 209/573

(56) References Cited

U.S. PATENT DOCUMENTS

| | | |
|---|---|---|
| 5,068,547 A | 11/1991 | Gascoyne |
| 5,155,432 A | 10/1992 | Mahoney |
| 5,249,281 A | 9/1993 | Fuccio et al. |
| 5,313,424 A * | 5/1994 | Adams et al. ............... 365/200 |
| 5,381,417 A | 1/1995 | Loopik et al. |
| 5,486,786 A | 1/1996 | Lee |
| 5,497,381 A | 3/1996 | O'Donoghue et al. |
| 5,524,114 A | 6/1996 | Peng |
| 5,533,194 A | 7/1996 | Albin et al. |
| 5,535,164 A | 7/1996 | Adams et al. |
| 5,574,692 A | 11/1996 | Dierke |
| 5,577,050 A | 11/1996 | Bair et al. |
| 5,608,257 A | 3/1997 | Lee et al. |
| 5,633,599 A | 5/1997 | Kubota |
| 5,646,948 A | 7/1997 | Kobayashi et al. |
| 5,663,967 A | 9/1997 | Lindberg et al. |
| 5,734,615 A | 3/1998 | Dierke |
| 5,748,543 A | 5/1998 | Lee et al. |
| 5,761,489 A | 6/1998 | Broseghini et al. |
| 5,764,655 A | 6/1998 | Kirihata et al. |
| 5,764,878 A | 6/1998 | Kablanian et al. |
| 5,822,228 A | 10/1998 | Irrinki et al. |
| 5,909,404 A | 6/1999 | Schwartz |
| 5,917,764 A | 6/1999 | Ohsawa et al. |
| 5,920,515 A * | 7/1999 | Shaik et al. ................. 365/200 |
| 5,956,350 A | 9/1999 | Irrinki et al. |
| 6,011,734 A * | 1/2000 | Pappert ...................... 365/200 |
| 6,067,262 A | 5/2000 | Irrinki et al. |
| 6,081,910 A | 6/2000 | Mifsud et al. |
| 6,085,334 A * | 7/2000 | Giles et al. ..................... 714/7 |
| 6,367,042 B1 | 4/2002 | Phan et al. |
| 6,433,294 B1 * | 8/2002 | Nemoto et al. ............. 209/573 |

OTHER PUBLICATIONS

U.S. patent application Ser. No. 08/972,137, Schwarz et al., filed Nov. 1997.
U.S. patent application Ser. No. 09/209,938, Irrinki et al., filed Dec. 1998.
U.S. patent application Ser. No. 09/209,996, Phan et al., filed Dec. 1998.

* cited by examiner

*Primary Examiner*—David Ton
(74) *Attorney, Agent, or Firm*—Akin, Gump, Strauss, Hauer & Feld, LLP (57) ABSTRACT

An integrated circuit includes built-in self test (BIST) and built-in self repair (BISR) circuitry, a fuse array capable of storing information related to defective memory locations identified during the manufacturing process. During manufacture, the integrity of the embedded memory of the integrated circuit is tested under a variety of operating conditions via the BIST/BISR circuitry. The repair solutions derived from these tests are stored and compiled in automated test equipment. If the repair solutions indicate that the embedded memory is repairable, the on-chip fuse array of the integrated circuit is programmed with information indicative of all of the detected defective memory locations. The built-in self repair circuitry of the integrated circuit is not executed upon power up. Instead, the repair information stored in the fuse array is provided to address remap circuitry within the BISR circuit. When an access to one of these memory locations is attempted during normal operation of the integrated circuit, the BISR circuitry remaps the memory operation to a redundant memory element.

15 Claims, 4 Drawing Sheets

BUILT-IN SELF REPAIR CIRCUITRY UTILIZING PERMANENT RECORD OF DEFECTS

CROSS-REFERENCE TO RELATED APPLICATIONS

This application is a continuation of co-pending U.S. application Ser. No. 09/237,769, filed Jan. 26, 1999, now abandoned.

STATEMENTS REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

The present invention relates to testing of integrated circuits, and more particularly to a method for performing built-in self repair operations without the need to perform built-in self test.

2. Description of the Related Art

Improvements in semiconductor processes are making possible integrated circuits of increasing size and complexity. The semiconductor processing technologies that produce these integrated circuits have advanced to the point where complete systems, including memories, can now be reduced to a single integrated circuit or application specific integrated circuit (ASIC) device. These integrated circuits (also referred to as "die" or "chips") may use many functions that previously could not be implemented on a single die. It is a common practice for the manufacturers of such integrated circuits to thoroughly test device functionality at the manufacturing site. However, due to the complex nature of today's integrated circuits and a concomitant sensitivity to variations in manufacturing processes, manufacturers are constantly confronted with new testing challenges.

Before manufacturers release integrated circuits for shipment, the devices typically undergo a variety of testing procedures. In ASIC devices incorporating integrated memories, for example, specific tests are performed to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects. Such manufacturing issues are likely to increase as process geometries continue to shrink and the density of memory cells increases. Even today, up to 100 Mbits or more of dynamic random access memory (DRAM), or several megabits of static random access memory (SRAM) or flash memory can be integrated onto a single integrated circuit.

A number of ASIC memory testing strategies have evolved, many of which involve use of an external memory tester or Automated Test Equipment (ATE). If memory is accessible from input/output (I/O) pins, either directly or by multiplexing, a hardware test mode can be utilized. In this mode, a production test system accesses the memory directly by writing to and reading from the memory bits. While this methodology does not use any chip area other than simple multiplexing circuitry, it is limited to on-chip memories and other circuitry accessible via I/O pins. Another drawback of this approach is that ATE capabilities are generally not available to end-users once the devices have been shipped, making it difficult to detect faults occurring after shipment.

If an embedded memory is buried deeply within an ASIC, built-in self-test (BIST) is often considered the most practical and efficient test methodology and is becoming increasingly popular with semiconductor vendors. BIST allows timely testing of the memory with a reasonably high degree of fault coverage, without requiring complex external test equipment and large amounts of external access circuitry. With BIST, memory or logic circuitry can be tested at any time in the field. This capability offers some degree of continued fault protection.

BIST refers in general to any test technique in which test vectors are generated internal to an integrated circuit or ASIC. Test vectors are sequences of signals that are applied to integrated circuitry to determine if the integrated circuitry is performing as designed. BIST can be used to test memories located anywhere on the ASIC without requiring dedicated I/O pins, and can be used to test memory or logic circuitry every time power is applied to the ASIC, thereby allowing an ASIC to be easily tested after it has been incorporated in an end product. A number of software tools exist for automatically generating BIST circuitry, including RAMBIST Builder by LSI Logic of Milpitas, Calif. Such software produces area-efficient BIST circuitry for testing memories, and reduces time-to-market and test development costs.

In the BIST approach, a test pattern generator and test response analyzer are incorporated directly into the device to be tested. BIST operation is controlled by supplying an external clock and via use of a simple commencement protocol. BIST test results are typically compressed—usually to the level of "passed" or "failed". At the end of a typical structured BIST test, or "run", a simple pass/fail signal is asserted, indicating whether the device passed or failed the test. Intermediate pass/fail signals may also be provided, allowing individual memory locations or group of locations to be analyzed. Unlike external testing approaches, at-speed testing with BIST is readily achieved. BIST also alleviates the need for long and convoluted test vectors and may function as a surrogate for functional testing or scan testing. Since the BIST structures exist and remain active throughout the life of the device, BIST can be employed at the board or system level to yield reduced system testing costs, and to reduce field diagnosis and repair costs.

In addition to the aforementioned testing procedures, manufacturers use a number of techniques to repair faulty memories when feasible. Such techniques include bypassing defective cells using laser procedures and fused links that cause address redirection. However, such techniques are limited to one-time repair and require significant capital investment. Further, these techniques may leave integrated circuits useless if the repaired memories become defective after shipment from the manufacturing site—even where test equipment is available to end users, traditional field repairs have been expensive, time consuming, and largely impracticable.

In order to enhance the repair process, on-chip built-in self repair (BISR) circuitry for repairing faulty memory cells has evolved. BISR circuitry functions internal to the integrated circuit without detailed interaction with external test or repair equipment. In the typical BISR approach, suitable test algorithms developed and implemented in BIST or BIST-like circuitry. These test patterns may be capable of detecting stuck-at, stuck-open, bridging faults and retention faults during memory tests. Following execution of the test patterns, the BISR circuitry analyzes the BIST "signature" (results) and, in the event of detected faults, automatically reconfigures the defective memory utilizing redundant memory elements to replace the defective ones. A memory incorporating BISR is therefore defect-tolerant. The assignee of the present invention, LSI Logic Corporation, has addressed different methods of repairing faulty memory locations utilizing BIST and BISR circuitry, as disclosed in U.S. Pat. No. 5,764,878, entitled "BUILT-IN SELF REPAIR SYSTEM FOR EMBEDDED MEMORIES", U.S. patent application No. 09/209,938, entitled "REDUNDANCY ANALYSIS FOR EMBEDDED MEMORIES WITH BUILT-IN SELF TEST AND BUILT-IN SELF REPAIR" filed Dec. 11, 1998, now U.S. Pat. No. 6,067262, and U.S. patent application No. 09/209,996, entitled "TESTING SCHEME FOR EMBEDDED MEMORIES USING BISR AND FUSE ID" filed Dec. 11, 1998, now U.S. Pat. No. 6,367,042, all of which are hereby incorporated by reference as if set forth in their entirety.

BISR compliments BIST because it takes advantage of on-chip processing capabilities to re-route bad memory bits rather than using an expensive and slow laser burning process to replace faulty memory locations. Some BISR circuitry is capable of repairing the faulty memory locations by redirecting the original address locations of faulty memory lines to the mapped addressed locations of the redundant columns and rows. Options for repair include either row and column replacement when a bad bit is found in a particular row or column.

An important feature of any integrated circuit is its reliability. Engineers strive to design integrated circuits that operate under a range of conditions (including temperatures and voltages) without malfunctioning. Therefore, it is often desirable to test dies (or "dice") under realistic field conditions during the manufacturing production cycle to ensure operability. This testing is done before singulation (i.e., separation) of the individual dies from a wafer. Furthermore, instead of using costly external test patterns to test memory locations, it is desirable to use the BIST circuitry with external ATE. The external tester is programmed to "test" a die's embedded memory by examining the outputs of the its BIST circuitry. With stand alone memory devices, manufacturers use expensive memory ATEs/redundancy analyzers to test over a range of conditions. Typically, a worst set of operating conditions is applied and any detected faults are repaired, if possible, using fuse structures that are integrated within the memory array of the stand-alone memory device.

With embedded memories, current BIST methodologies may not adequately detect memory locations having faults that are dependent on operating conditions (e.g., normal variations in voltage, timing, power supply disturbances and temperature). Even with BIST/BISR, memory elements can pass the power-up BIST under an initial set of operating conditions, only to fail during normal operation when the die is subsequently subjected to another set of operating conditions. Further, since BISR structures have a limited number of redundant memory locations, a device may be repairable only under select operating conditions. The problem may be exacerbated by the rigors of the packaging process, which may give rise to failure mechanisms not present in a given integrated circuit before singulation. Since BIST/BISR is typically run only once during a power cycle, any memory locations that fail after power-up may not be repaired. Such failures may cause the chip to be unsuitable for its intended use. Additionally, the execution time and off-chip circuitry required by BIST circuitry may be undesirable for certain end products.

BRIEF SUMMARY OF THE INVENTION

Briefly, the present invention provides a method and circuitry for providing memory fault information to and performing built-in self repair operations in an integrated circuit without the requirement of first performing a built-in self test procedure. In accordance with the invention, a fuse array or other non-volatile memory device is provided to store information related to defective memory locations identified during the manufacturing process.

In the disclosed embodiment of the invention, an integrated circuit die of a semiconductor wafer is provided with BIST/BISR circuitry and an embedded memory or similar circuit. The integrated circuit also includes a fuse array or other none-volatile circuitry capable of storing address information for defective memory locations. During manufacture, the integrity of the embedded memory of each integrated circuit die is preferably tested under a variety of conditions (also referred to as stress factors) via the BIST/BISR circuitry. The results of these tests are stored and compiled in ATE. The results are also referred to as BIST signatures or memory repair solutions. If the repair solutions indicate that the embedded memory is repairable, the on-chip fuse array of the integrated circuit is programmed with information indicative of all of the detected defective memory locations. Programming of the fuse array may occur prior to or following singulation and packaging of the integrated circuit die.

Once packaged and incorporated within an end product, the built-in self repair circuitry of the integrated circuit die is not executed upon power up. Instead, the repair information stored in the fuse array is provided to address remap circuitry within the BISR circuit. The repair information represents faulty memory locations detected during the manufacturing testing process under a variety of operating conditions. When an access to one of these memory locations is attempted during normal operation of the integrated circuit, the BISR circuitry remaps the memory operation to a redundant memory element.

Thus, an integrated circuit implemented according to the present invention obviates the requirement of executing built-in self test each time power is supplied to the circuit, thereby simplifying the board-level design of the end product. Programming of the fuse array can be accomplished with any logic tester, and does not require redundancy analyzers or other expensive memory tester hardware. Further, because the stored fault information reflects test data gathered at a variety of operating conditions, the built-in self repair circuitry is capable of providing a higher degree of fault coverage than traditional BIST methods.

BRIEF DESCRIPTION OF THE SEVERAL VIEWS OF THE DRAWINGS

A better understanding of the present invention can be obtained when the following detailed description of the preferred embodiment is considered in conjunction with the following drawings, in which.

DETAILED DESCRIPTION OF THE INVENTION

Figure 1:
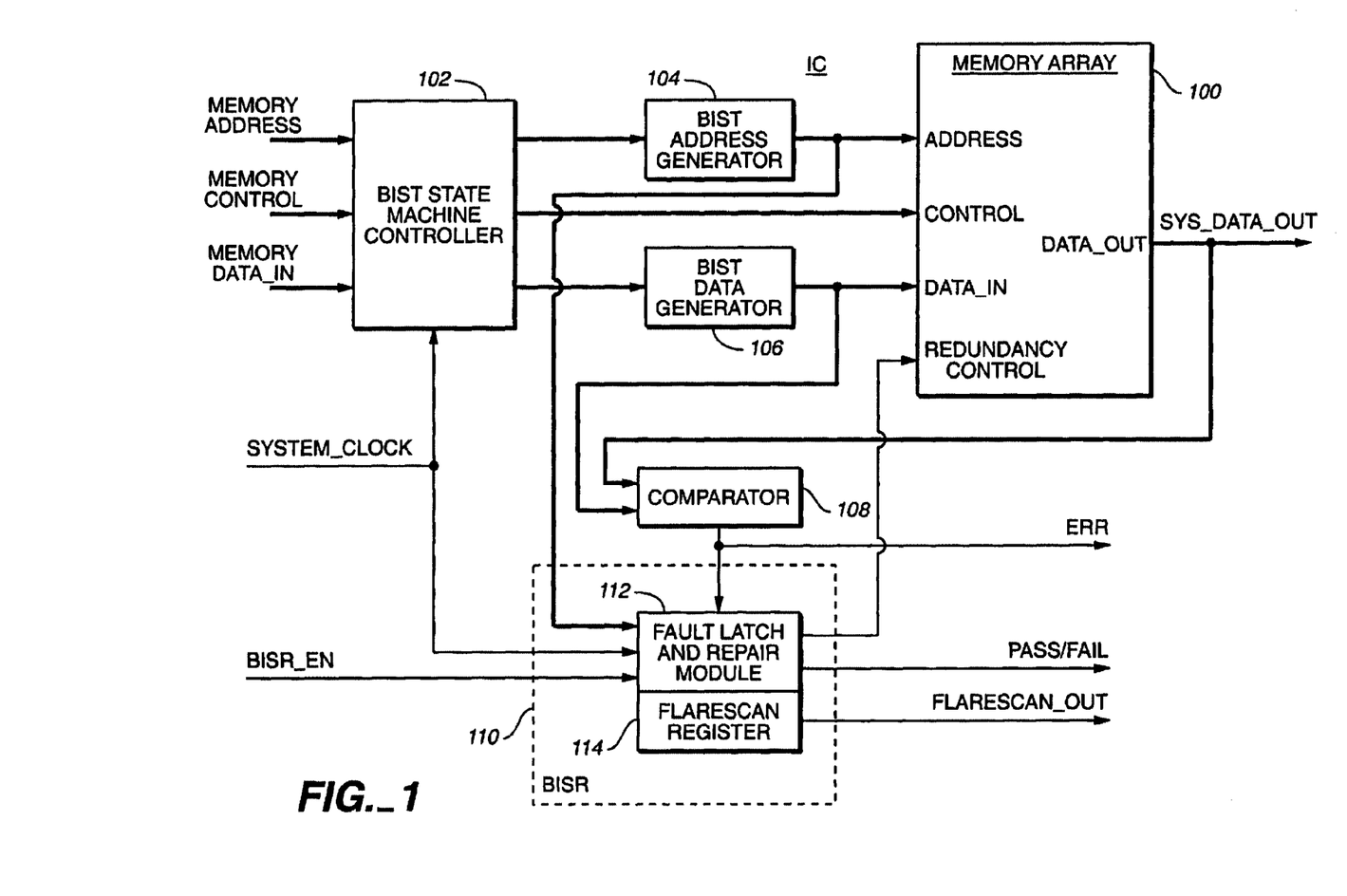
FIG. 1 is a schematic diagram of an integrated circuit incorporating BIST/BISR and identification circuitry capable of being utilized with the present invention.

Turning now to the drawings, FIG. 1 provides a simplified schematic diagram of an exemplary integrated circuit IC incorporating testing and repair capabilities capable of being utilized in conjunction with the present invention. This circuitry is combined with a fuse array circuit 150 or other non-volatile storage circuit as described in greater detail below in conjunction with FIG. 2.

The integrated circuit IC comprises a built-in self-test (BIST) state machine/controller 102 for controlling the various other components of the disclosed memory BIST system, a built-in self repair (BISR) circuit 110, and a memory array 100. In addition to the BIST state machine/controller 102, other components of the BIST circuitry include an address generator 104, a data generator 106 and a comparator 108. The BIST circuitry functions to generate and execute test patterns for detecting column and row faults in the memory array 100.

The BISR circuitry 110 is coupled to the memory array 100 and operates in conjunction with the BISR circuitry to repair detected faults in the memory array 100. The repair process may be accomplished by any of a number of techniques, including redirecting the original address locations of faulty memory elements to the mapped address locations of redundancy elements. The BISR circuitry 110 of the disclosed embodiment comprises a fault latch and repair module 112 and a FLARESCAN register 114. The memory array 100 may be a dynamic random access memory (DRAM), a static random access memory (SRAM), a read-only memory (ROM), or any other type of circuitry having a structured array(s) of elements conducive to built-in self test and repair.

In the disclosed embodiment of the invention, the BIST state machine/controller 102 includes a test pattern generator to generate test pattern algorithms used to detect various types of memory faults, including column line faults, row faults, and retention faults. The test pattern generator is preferably configured to produce a pattern that provides optimal fault coverage in identifying faulty memory cells of the memory array 100. A memory BIST process for use with the present invention can be implemented in several different ways, including a simple one-pass process that only provides pass/fail information to complex, multi-pass systems with several diagnostic modes.

There are two main types of deterministic memory test pattern algorithms: a "march" test and a "neighbor pattern sensitive" test. Either of these tests (or others) could be utilized in an integrated circuit IC according to the present invention. The march test generally refers to a finite sequence of tests performed on each cell in a memory array 100. All of the cells of the memory array 100 are subjected to the same test, and memory cells are tested in either forward or reverse order. March tests are capable of covering all address faults, stuck-at faults, independent coupling faults, linked coupling faults, transition faults, and transition faults linked with coupling faults. Neighbor pattern sensitive tests involve testing every cell of the memory array 100 in relation to the set of neighboring cells, including a base cell. These tests generally require more time to run than march tests, and are capable of covering active, passive, and static neighborhood pattern sensitive faults. Such faults may include stuck-at faults and all coupling and transition faults between physically adjacent memory cells.

On-chip BIST structures such as the BIST state machine/controller 102 typically communicate with external devices via an IEEE 1149.1 compliant interface. When implemented with this interface, IEEE 1149.1 test access port (TAP) and boundary scan structures (not shown) are also present on the integrated circuit IC. When implemented in such a fashion, a simple command sequence initiates BIST operation. After the BIST circuitry has completed its test patterns, the BIST state machine/controller 102 scans the results to off-chip test equipment via the test access port. In the disclosed embodiment of the invention, the BIST "signature" can also be retrieved via an output of the FLARESCAN register 114 as discussed more fully below.

The various outputs of the BIST state machine/controller 102 shown in FIG. 1 provide the logical states and inputs for the memory array 100 during testing, and are provided in a sequence as specified by a test pattern algorithm. More specifically, the BIST state machine/controller 102 provides inputs and control signals to the BIST address generator 104 and the BIST data generator 106. In addition, the control input CONTROL (which may take the form of a write enable input) of the memory array 100 is driven by the BIST state machine controller 102 during memory accesses.

The disclosed embodiment of the BIST state machine/controller 102 receives standard memory address bus signals MEMORY ADDRESS, data bus signals MEMORY DATA_IN and control signals MEMORY CONTROL provided by other components or input pins of the integrated circuit IC. In another contemplated embodiment, these signals are provided to the memory array 100 via separate multiplexing circuitry (not shown). These signals are selectively applied to the memory array 100 based upon the test and/or repair status of the memory array 100. As shown, the DATA_IN inputs of the memory array 100 are driven by outputs of the BIST data generator 106. The outputs of the BIST data generator 106 are determined by BIST state machine controller 102, and may comprise either system data (MEMORY DATA_IN) during normal operation of the integrated circuit IC or test data during memory testing procedures.

Similarly, the ADDRESS inputs of the memory array 100 are driven by the output(s) of the BIST address generator 104. The outputs of the BIST address generator 104 thereby control the address inputs of the memory array 100 during execution of a test pattern algorithm. Thus, the BIST address generator 104 and BIST data generator 106 may provide address and data sequences, respectively, to the memory array 100 in an order as specified by a test pattern algorithm. Preferably, such sequences provide a set of data bits in a pattern that maximizes fault coverage for detecting various types of faults within the memory array 100. A system clock signal SYSTEM_CLOCK is also provided to both the BIST state machine controller 102 and the BISR circuitry 110 for logic clocking and synchronization.

During testing, data patterns provided to the memory array 100 by the BIST circuitry are propagated through the memory array 100 to the output bus SYS_DATA_OUT. Under BIST operation, these outputs are routed to the comparator 108, which compares the outputs of the memory array 100 on a read cycle against the corresponding binary bits produced by the BIST data generator 106 on the initiating write cycle. In the disclosed embodiment of the invention, an error signal ERR driven by the output of the comparator 108 is provided to the fault latch and repair module of the BISR circuitry 110. If there is no difference between DATA_IN and DATA_OUT, the error signal ERR is not asserted. If there is a difference, the ERR signal is asserted to indicate that a fault has been detected at that particular memory location.

The error signal ERR is utilized by the BISR circuitry 110 to perform self repair operations on the memory array 100. More specifically, the fault latch and repair module 112 repairs defective memory locations by redirecting accesses to defective address locations to address locations which can retain valid data. To this end, a redundant memory location control signal REDUNDANCY CONTROL is provided from the fault latch and repair module 112 to the memory array 100, and is asserted as necessary to prevent access to faulty memory locations. The fault latch and repair module 112 monitors the output of the BIST address generator 104 to identify pending accesses to defective memory locations. As detailed below, such memory locations are identified by the fuse array 150 after the integrated circuit IC has been incorporated into an end product. The fault latch and repair module 112 also provides a pass/fail signal PASS/FAIL to other circuitry, which may include external test equipment or the BIST state machine controller 102.

In the disclosed embodiment, the addresses of faulty memory locations are provided from the fault latch and repair module 112 to a fault-latching and repair execution, or FLARESCAN, register 114. The contents of the FLARESCAN register 114 may then be scanned out to ATE via a register output signal FLARESCAN_OUT. Table 1 is an exemplary bit capture file retrieved from a FLARESCAN register 114 following execution of BIST/BISR procedures, and represents faulty memory locations of different integrated circuits IC of a single wafer (not separately illustrated). Data from subsequent BIST runs can be compared as described below to determine if additional memory locations fail under different stress factors. Further details of one such comparison process can also be found in the previously incorporated U.S. Patent Application entitled "REDUNDANCY ANALYSIS FOR EMBEDDED MEMORIES WITH BUILT-IN SELF TEST AND BUILT-IN SELF REPAIR."

mation indicative of defective memory locations in the memory array 100. Details of an exemplary process for programming the fuse array 150 are provided in conjunction with FIGS. 3A–3B.

Figure 2:
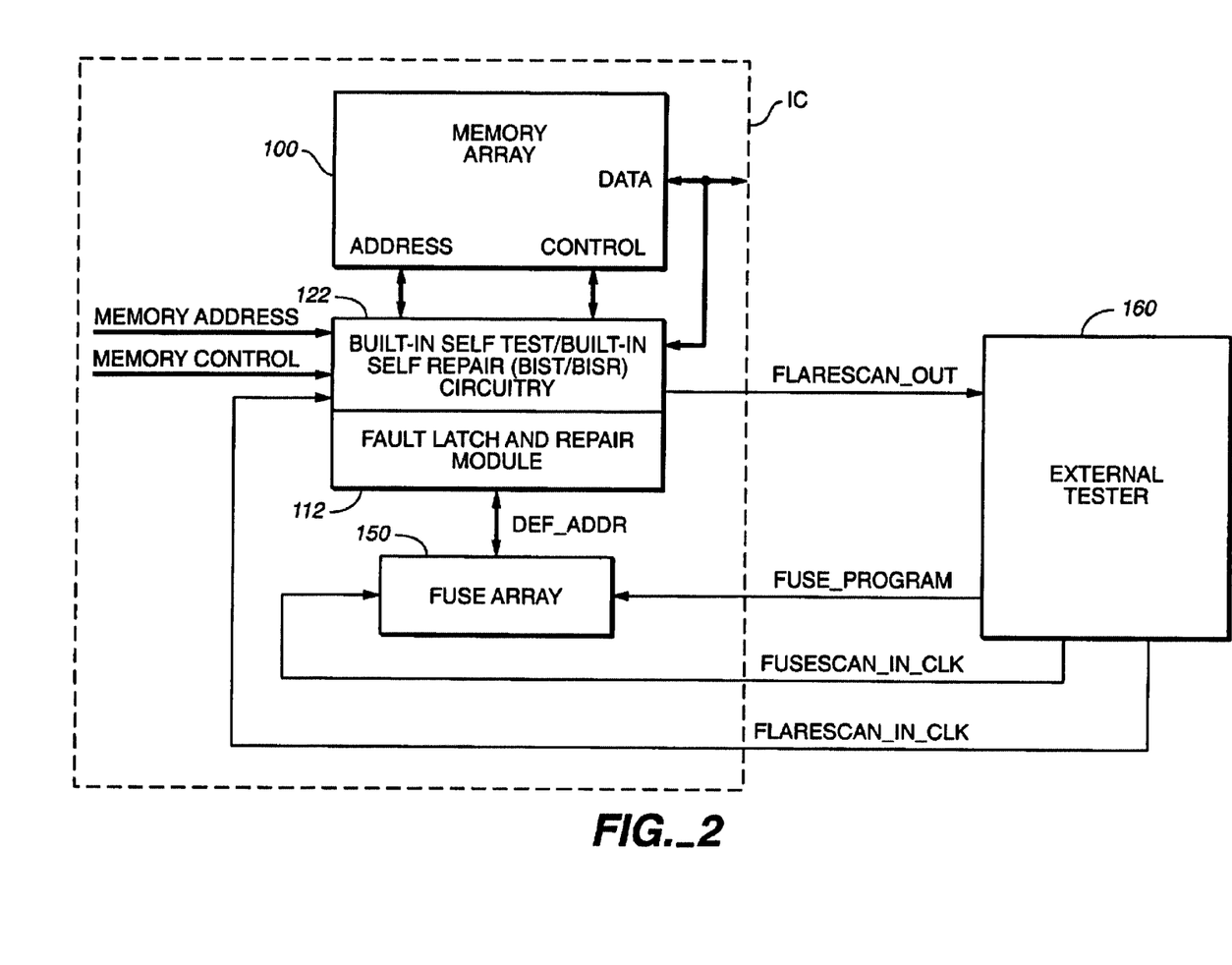
FIG. 2 is a block diagram of an external test system and an integrated circuit die incorporating built-in self repair capabilities according to the present invention.

The integrated circuit IC further includes BIST/BISR circuitry 122 such as that shown in FIG. 1. The BIST/BISR circuitry 122 interfaces with an embedded memory array 100 as previously described, and also communicates with the external ATE 160 via the register output FLARESCAN_OUT or similar means. The register output signal FLARESCAN_OUT provides the external ATE 200 with addresses of memory locations of the embedded memory array 100 which fail BIST analysis.

In the disclosed embodiment of the invention, clocking of the BIST/BISR circuitry 122 is controlled by a clock signal FLARESCAN_IN_CLK from the external ATE 160. Other control signals may also be communicated as necessary from the external ATE 160 to the BIST/BISR circuitry 122.

In accordance with the present invention, the fuse array circuit 150 or other permanent storage means is provided in the integrated circuit IC in order to store information indicative of detected defective memory locations in the memory array 100. This information is provided to remap circuitry within the fault latch and repair module 112 via a defective address signal line or bus DEF_ADDR. The fuse array 150 is programmed with the defective memory locations information via a fuse program signal(s) FUSE_PROGRAM and fuse clock signal FUSESCAN_IN_CLK provided by the external ATE 160. Alternatively, the fuse array 150 may be programmed via circuitry located on the integrated circuit IC itself (not shown). In addition, the fuse array 150 may utilize other clock signal sources such as the clock signal FLARESCAN_IN_CLK or a clock signal source internal to the integrated circuit IC.

The illustrated test arrangement is exemplary in nature, and the precise arrangement and electrical couplings between the external ATE 160 and the integrated circuit IC is not considered critical to the invention. Many different signal arrangements could be used to communicate failure information from the integrated circuit IC to the external ATE 160. Further, it is contemplated that a testing procedure according to the disclosed embodiment of the invention could be utilized for electrical components of an integrated circuit IC other than embedded memories.

TABLE 1

| FLARESCAN BIT CAPTURE FILE |
|---|
| Z733163R.1    W03    X129    Y131<br>     0000000000000000000000000000000000000000000000000000<br>0000000000000000000000000000000000000000000000000000000000000000000000000000<br>0000000000000000000000000000000000000000000000000000 |
| Z733163R.1    W03    X128    Y131<br>     0000000000000000000000000000000000000000000000000000<br>000000000000000000000000000000000000000000000000000000000000000000000011111110010100000<br>000000000000000000000000000000001111111101110000000000000 |
| Z733163R.1    W03    X126    Y130    0000000000000000000000000000000000000000000000000000<br>00000000000000000000001111111101100000000000000000000000000001111111100100000000000000<br>000000000011111110011111111111011111111111011100000000000 |

Referring now to FIG. 2, a simplified diagram is provided for an external tester 160 and an integrated circuit IC incorporating built-in self repair capabilities in accordance with the present invention. The integrated circuit IC incorporates a fuse array 150 which is programmed with infor- Likewise, the precise structure of the fuse array 150 is not considered critical to the invention, and many different fuse array circuits could be utilized as will be appreciated by those skilled in the art. For example, individual fuse elements according the invention may be constructed of a variety of materials, including: aluminum, copper, polysilicon, silicide or other conductive metal or alloy. In a conventional fuse element, two conductive lines are jointed by a "neck" portion having a width considerably less than that of the conductive lines. When programming a fuse element, this neck region is removed or blown out (i.e., melted away) via laser beam or similar methodology. A large number of individual fuse elements are placed side-by-side to form a fuse bank.

Figure 3A:
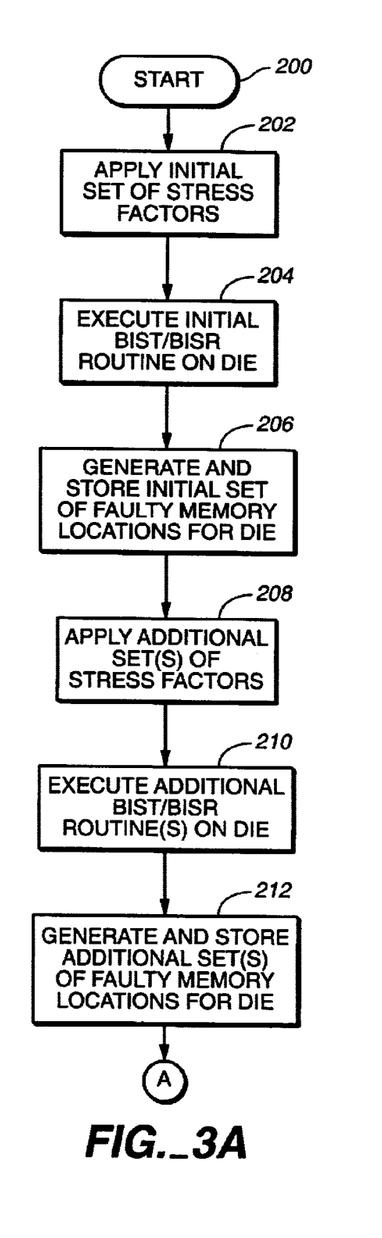
FIGS. 3A and 3B are flowchart illustrations of an exemplary procedure according to the present invention for programming a fuse array.
Figure 3B:
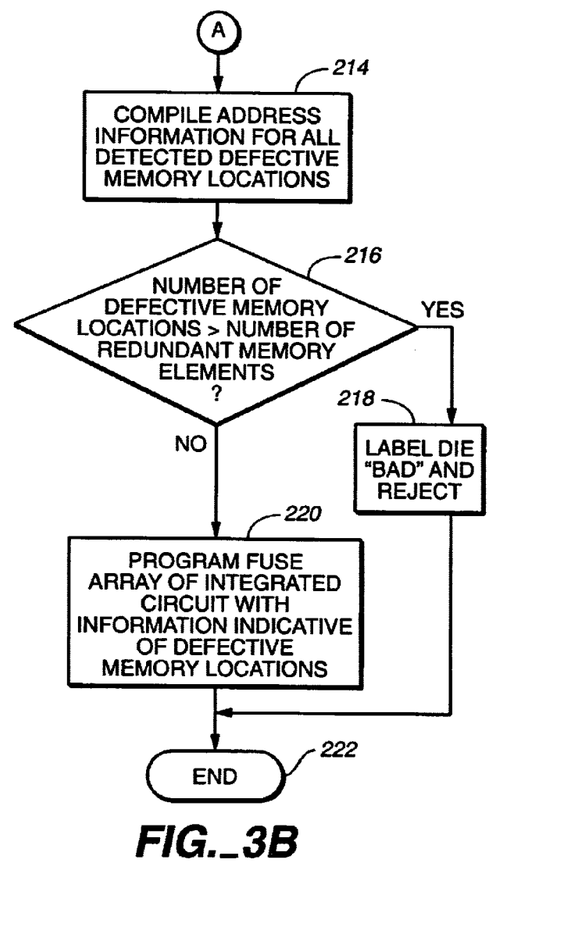

Referring now to FIGS. 3A and 3B, flowcharts of an exemplary procedure according to the present invention for programming a fuse array 150 are provided. Briefly, the procedure involves many potential stages, including execution of BIST/IBISR routines at at least one set of operating conditions or stress factors, followed by programming of the fuse array 150 with information indicative of resulting detected defective memory locations. The BIST/BISR routines may be executed prior to singulation of the integrated circuit IC from the semiconductor wafer and/or after the integrated circuit IC has been subjected to the rigors of the packaging process. As described in greater detail in conjunction with FIG. 4, the information stored within fuse array 150 is utilized by the BISR circuitry 110 to repair defective memory locations of the memory array 100 without the necessity of first performing a BISR procedure.

It should be understood that the term "stress factor" refers to one or more environmental or operating conditions, and may include varying combinations of factors, such as temperature and humidity, temperature and voltage, speed and voltage, etc. For example, temperature and voltage may be applied to the integrated circuit IC under minimum/maximum operating conditions. Typically, a BIST/BISR run is executed when the integrated circuit IC is subjected to minimum temperature and maximum voltage. In addition, a BIST/BISR run is normally executed when the integrated circuit IC is subjected to maximum temperature and minimum operating voltage. As will be appreciated by those skilled in the art, different failure mechanisms may be manifested under different operating conditions. Consequently, the integrated circuit IC is preferably subjected to a host of stress factors and is tested under various conditions to improve the reliability and accuracy of the information stored within the fuse array 150.

Beginning with FIG. 3A, the exemplary fuse array 150 programming procedure is described in greater detail. Following commencement of the programming procedure (step 200) for a given integrated circuit IC, the integrated circuit IC is exposed to an initial set of one or more stress factors in step 202. As an example, the integrated circuit IC may be subjected to a minimum temperature as specified in the data sheet of the device. A predetermined amount of time is preferably allowed to elapse in order for the integrated circuit IC to adjust to the initial set of stress factors. Power is also applied to the integrated circuit IC at this stage. Next, an initial BIST/BISR routine is executed at step 204. In the disclosed embodiment of the invention, diagnosis of the integrated circuit IC by the BIST/BISR circuitry 122 is performed upon an initial power-up or when initiated by the external ATE 160. In conjunction with step 204, an initial set of faulty memory locations for the integrated circuit IC under test is developed in step 206. This initial set of faulty memory locations (e.g., the BIST signature), as well as any other desired information, is then retrieved and stored by the external ATE 160.

Next, one or more additional sets of stress factors are applied to the integrated circuit IC under test in optional step 208. For example, the integrated circuit IC may be subjected to a maximum of specified temperature and other stress factor such as a supply voltage variation. For each additional set of stress factors, an additional BIST/BISR routine is executed as depicted in step 210. For each such additional BIST/BISR routine, an additional set of faulty or defective memory locations is generated and stored in the ATE 160 as shown in step 212.

The illustrated procedure continues in step 214 (FIG. 3B) where the external ATE 160 compiles address information for all of the defective memory locations detected in the previous steps. This step may be used to eliminate redundancies in the address/fault information. Next, in step 216, the number of defective memory locations is examined to determine if a sufficient number of redundant memory elements exists to repair the defective locations. If the number of defective memory locations exceeds the number of redundant memory elements, the integrated circuit IC is labeled as "bad" as step 218 and it is rejected. If it is determined in step 216 that the memory array 100 is repairable, the procedure continues in step 220 and the fuse array 150 of the integrated circuit IC is programmed with fault information indicative of the detected defective memory locations. Following either steps 220 or 218, the procedure ends in step 222.

One skilled in the art will appreciate that programming of the fuse array 150 need not necessary be performed after all BIST/BISR runs, but could be performed after each run. Further, as previously noted, programming of the fuse array 150 could be accomplished via circuitry incorporated within the integrated circuit IC itself. In any event, the information programmed in the fuse array 150 can be subsequently utilized by the BIST/BISR circuitry 122 without first performing a BIST analysis.

It will also be appreciated that execution of the BIST/BISR routines in steps 204 and 210 may be performed both prior to and following singulation and packaging of the integrated circuit IC from the other die of the semiconductor wafer. The rigors of the assembly or packaging process may create new failure mechanisms for the singulated integrated circuit IC, and it is therefore desirable that at least one BIST/BISR routine be performed on the package part. In addition, the manufacturing and testing process may include a step referred to in the art as "burn-in". Burn-in generally refers to the process of exercising an integrated circuit IC at elevated voltage and temperature. This process accelerates failures normally manifested as "infant mortality" (the early portion of the bath tub curb at the which failures decline with exposure to time) in a semiconductor device. Execution of the BIST/BISR routines is preferably performed following the burn-in process such that any resulting memory defects may be represented in the fuse array 150.

Compiling the results of BIST/BISR routines under the various sets of stress factors, both pre- and post-packaging, improves the fault coverage of the manufacturing test process. By analyzing the memory array 100 under various test conditions, and providing the compiled results to the fuse array 150, all faulty memory locations are repaired at the same time—even if the failure mechanisms are dependent on operating conditions.

Figure 4:
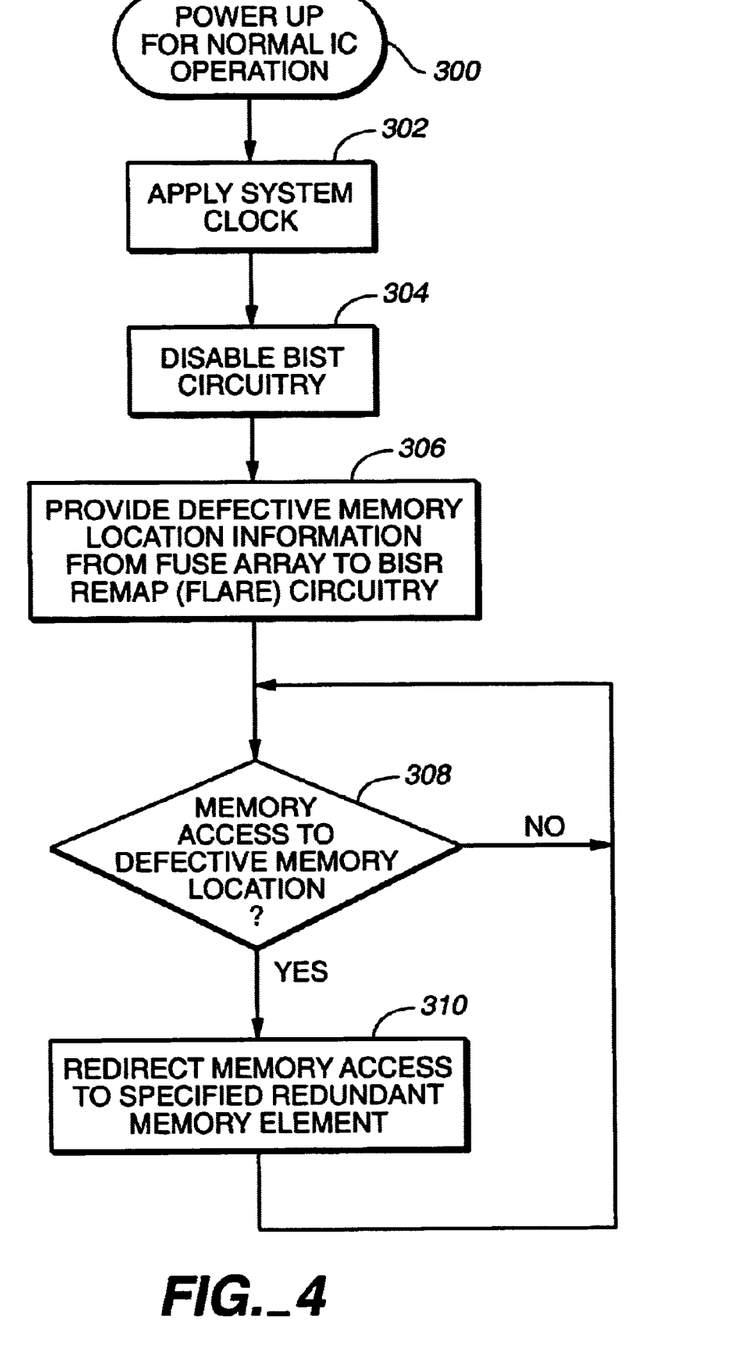
FIG. 4 is a flowchart illustration of typical operation of an integrated circuit manufactured in accordance with the present invention.

Referring now to FIG. 4, a flowchart illustration of operation of an integrated circuit IC incorporating a programmed fuse array 150 according to the present invention is depicted. The integrated circuit IC is incorporated into an end product or circuit board prior to execution of the illustrated steps. Following power up of the integrated circuit IC in step 300, a system clock is applied in step 302.

Next, in step 304, the BIST circuitry of the integrated circuit IC is disabled. Disabling of the BIST circuitry may be accomplished in a variety of ways. For example, off-chip componentry may be used to assert a BIST disable input to the integrated circuit IC. Alternatively, the integrated circuit IC may be manufactured and packaged in such a manner that the BIST circuitry is disabled without intervention by off-chip componentry. As will be appreciated by those skilled in the art, disabling of the BIST circuitry may simplify board level design for the target product of the integrated circuit IC, and provides for faster power-up of the integrated circuit IC.

Next, in step 306, the defective memory location information programmed into the fuse array 150 is provided to remap circuitry within the BIST/BISR circuitry 122. This information is used to repair faulty memory locations in much the same way that the results of a BIST run are used by traditional BISR circuitry. To this end, the BIST/BISR circuitry 122 monitors memory accesses to identify attempts to access defective memory locations as shown in step 308. If an access is not directed to a faulty memory location, normal memory access is permitted. If a defective memory location is addressed as determined in step 308 (vis-a-vis the information provided by the fuse array 150), the memory access is redirected to a specified redundant memory element as shown in step 310. Subsequent memory accesses are handled in the same manner.

Thus, a method has been described for performing built-in self repair operations in an integrated circuit without first performing a built-in self test procedure. In the disclosed embodiment of the invention, the integrated circuit is provided with a fuse array or other non-volatile memory device which is programmed with information related to defective memory locations identified during the manufacturing process. During use of the integrated circuit in an end product, this information is directly used by BISR circuitry to remap address accesses from faulty memory locations to redundant memory elements. The need to execute a BIST routine each time power is supplied to the integrated circuit is thereby obviated. Further, because the stored fault information reflects test data gathered at a variety of operating conditions, the built-in self repair circuitry is capable of providing a higher degree of fault coverage than traditional BIST methods.

The foregoing disclosure and description of the invention are illustrative and explanstory thereof, and various changes in the size, shape, materials, components, circuit elements, wiring connections and contacts, as well as in the details of the illustrated circuitry and construction and method of operation may be made without departing from the spirit of the invention.

I claim:

1. A method for providing fault information to an integrated circuit for purposes of performing built-in self repair, the integrated circuit having a built-in self test circuit, a built-in self repair circuit and a non-volatile storage circuit capable of providing repair information to the built-in self repair circuit, the method comprising the steps of:

applying a stress factor(s) to the integrated circuit;

performing a built-in self test analysis to detect faults in a predetermined portion of the integrated circuit;

generating fault information pertaining to any defects detected by the built-in self test analysis; and providing the fault information to the non-volatile storage circuit, wherein the step of providing the fault information to the non-volatile storage circuit is performed by automated test equipment (ATE).

2. A method for providing fault information to an integrated circuit for purposes of performing built-in self repair, the integrated circuit having a built-in self test circuit, a built-in self repair circuit and a non-volatile storage circuit capable of providing repair information to the built-in self repair circuit, the method comprising the steps of:

applying a stress factor(s) to the integrated circuit;

performing a built-in self test analysis to detect faults in a predetermined portion of the integrated circuit;

generating fault information pertaining to any defects detected by the built-in self test analysis;

providing the fault information to the non-volatile storage circuit;

applying a second stress factor(s) to the integrated circuit;

performing a second built-in self test analysis on the predetermined portion of the integrated circuit;

generating second fault information pertaining to any faults detected by the second built-in self test analysis; and providing the second fault information to the non-volatile storage circuit.

3. The method of claim 2, further comprising the step of compiling the first and second fault information to eliminate redundant information prior to providing the second fault information to the non-volatile storage circuit.

4. The method of claim 2, wherein the predetermined portion of the integrated circuit is an embedded memory and the first fault information is a first set of memory address locations and the second fault information is a second set of memory address locations.

5. The method of claim 2, wherein the first stress factor(s) and the second stress factor(s) comprises differing operating conditions.

6. The method of claim 2, wherein the first stress factor(s) comprises a minimum temperature and second stress factor(s) comprises a maximum temperature.

7. The method of claim 2, wherein the first stress factor(s) comprises a minimum voltage and the second stress factor(s) comprises a maximum voltage.

8. The method of claim 2, further comprising the steps of:

prior to the step of performing the second built-in self test analysis, singulating the integrated circuit; and packaging the integrated circuit to form a packaged part.

9. A method for providing fault information to an integrated circuit and performing corresponding built-in self repair operations, the integrated circuit having a built-in self test circuit, a built-in self repair circuit and a non-volatile storage circuit capable of providing repair information to the built-in self repair circuit, the method comprising the steps of:

applying at least one set of stress factor(s) to the integrated circuit;

performing a built-in self test analysis for each set of stress factor(s) to detect faults in a predetermined portion of the integrated circuit die;

generating a set of fault information pertaining to defects detected by each built-in self test analysis executed on the integrated circuit die;

providing the fault information to the non-volatile storage circuit;

incorporating the integrated circuit in a circuit board or end product;

communicating the fault information from the non-volatile storage circuit to the built-in self repair circuit, wherein the built-in self repair circuit utilizes the fault information to perform repair operations on the predetermined portion of the integrated circuit.

10. The method of claim 9, further comprising the step of:

prior to communicating the fault information from the non-volatile storage circuit, disabling the built-in self repair circuit of the integrated circuit.

11. The method of claim 9, further comprising the steps of:

prior to the step of incorporating the integrated circuit in a circuit board or end product, singulating the integrated circuit die; and packaging the singulated integrated circuit.

12. The method of claim 9, wherein the non-volatile storage circuit is a programmable fuse array.

13. The method of claim 9, wherein the predetermined portion of the integrated circuit is an embedded memory and the fault information relates to defective memory locations within the embedded memory.

14. The method of claim 13, wherein the built-in self repair circuit utilizes the fault information to perform repair operations by redirecting memory accesses from defective memory locations to redundant memory locations.

15. A method for providing fault information to an integrated circuit for purposes of performing built-in self repair, the integrated circuit having a built-in self test circuit, a built-in self repair circuit and a non-volatile storage circuit capable of providing repair information to the built-in self repair circuit, the method comprising the steps of:

applying a stress factor(s) to the integrated circuit;

performing a built-in self test analysis to detect faults in a predetermined portion of the integrated circuit;

generating fault information pertaining to any defects detected by the built-in self test analysis;

providing the fault information to the non-volatile storage circuit; and applying a second stress factor(s) to the integrated circuit.

* * * * *